United States Patent
Takahashi et al.

[11] Patent Number: 5,444,365
[45] Date of Patent: Aug. 22, 1995

[54] VOLTAGE MEASURING APPARATUS HAVING AN ELECTRO-OPTIC MEMBER

[75] Inventors: Hironori Takahashi; Tsuneyuki Urakami; Shinichiro Aoshima; Isuke Hirano, all of Hamamatsu, Japan

[73] Assignee: Hamamatsu Photonics K.K., Hamamatsu, Japan

[21] Appl. No.: 113,239

[22] Filed: Aug. 30, 1993

[30] Foreign Application Priority Data

Aug. 31, 1992 [JP] Japan .................. 4-231822

[51] Int. Cl.$^6$ .............................. G01R 1/04
[52] U.S. Cl. ........................ 324/96; 324/753; 435/808
[58] Field of Search ............ 324/96, 158 R, 158 D, 324/501, 758, 752–753; 435/808

[56] References Cited

U.S. PATENT DOCUMENTS

| | | | |
|---|---|---|---|
| 4,446,425 | 5/1984 | Valdmanis et al. | 324/77 K |
| 4,910,454 | 3/1990 | Williamson | 324/77 |
| 5,029,273 | 7/1991 | Jaeger | 324/96 |
| 5,041,779 | 8/1991 | Hales | 324/96 |

FOREIGN PATENT DOCUMENTS

| | | |
|---|---|---|
| 0138452 | 4/1985 | European Pat. Off. |
| 0213965 | 3/1987 | |
| 0344986 | 12/1989 | European Pat. Off. |
| 3311809 | 10/1984 | Germany |
| 9106014 | 5/1991 | WIPO |

OTHER PUBLICATIONS

Eisenstein et al, "High Quality Antireflection Coatings on Laser Facets by Sputtered Silicon Nitride", Applied Optics, vol. 23, No. 1, Jan. 1, 1984, pp. 161–164.
Valdmanis et al, "Subpicosecond Electrooptic Sampling: Principles and Applications", IEEE Journal of Quantum Electronics, vol. QE-22, No. 1, Jan. 1986, pp. 69–78.

*Primary Examiner*—Kenneth A. Wieder
*Assistant Examiner*—Barry C. Bowser
*Attorney, Agent, or Firm*—Cushman Darby & Cushman

[57] ABSTRACT

A change in voltage can be sensitively detected at a local part of a measured object. A set of laser medium and E-O probe are disposed between a pair of mirrors, a first one and a second one, forming a laser resonator. A linearly polarized light is emitted from the laser medium. The polarized light enters the E-O probe, and returns after being reflected by the second mirror. When a voltage is given to the E-O probe from the measured object, depending on the voltage, a refractive index of the E-O probe is changed, the light emitted from the E-O probe is ovally polarized, and a resonance status of the laser resonator then varies. Therefore, the light intensity emitted through the partially penetrating first mirror to the outside of the laser resonator corresponds to the voltage at the measured object in the proximity of the E-O probe. Consequently, a voltage distribution on the measured object such as IC with fine structures can be two-dimensionally detected.

9 Claims, 12 Drawing Sheets

FIRST EXAMPLE OF FORMATION OF VOLTAGE MEASURING APPARATUS

FIRST EMBODIMENT

ENLARGED DRAWING OF LIGHT SOURCE

SECOND EMBODIMENT

THIRD EMBODIMENT

FIFTH EMBODIMENT

VOLTAGE MEASURING APPARATUS HAVING AN ELECTRO-OPTIC MEMBER

BACKGROUND OF THE INVENTION

1. Field of The Invention

The present invention relates to a voltage measuring apparatus or an apparatus for the measurement of electrical voltages, and particularly to an apparatus for detecting and measuring infinitesimal voltages existing on the local parts of measured objects.

2. Related Background Art

There are methods for measuring voltages using an E-O probe of electro-optic materials, such as a method for the measurement of infinitesimal voltage signals given on the local parts of measured objects by detecting voltage changes on the local parts. More particularly, there is a method to detect infinitesimal voltages given on the local parts of measured objects, that makes use of a change of a refractive index of the electro-optic materials caused by a change of the electrical field established in the E-O probe disposed in the proximity of the local part of the measured object. See, U.S. Pat. No. 4,446,425.

An example of an existing voltage measuring system using an E-O probe is shown in FIG. 10. A refractive index of the E-O probe 4 varies in response to the electrical field established on the measured device 2, such as, a semiconductor device. A light beam emitted from a light source 6, which is controlled by a driving apparatus 5, passes through a collimating lens 8, a polarizing beam splitter 10, a wave plate 12 and a focusing lens 14 in this order and enters the E-O probe 4. Only the component of the light beam reflected by and returned from the E-O probe 4 that is orthogonal to the incident beam is separated by the polarizing beam splitter 10 and enter the photo detector 16 where the component light beam is converted to an electric signal. The electric signal reflects the change in the electrical field formed on the E-O probe 4, that is, the change in the electric signal given to the local part of the measured device 2.

FIG. 11 is a curve showing the operation principle of the voltage measuring apparatus in FIG. 10. In a case where the measured device 2 is one in which a circuit is formed with stripes on the surface of a substrate and an adequate signal source is connected with the device, the wave plate 12 is supposed to be removed. As indicated by the curve, the relationship between the voltage V given to the measured device 2 and the output intensity I detected by the photo detector 16 is generally described by the formula $I = I_0 \sin^2\{(\pi/2)(V/V_\pi)\}$. The output intensity I varies from $I_1$ to $I_2$ as the voltage V varies from $V_1$ to $V_2$. Accordingly, the voltage change in the circuit of the measured device 2 which the E-O probe 4 is in the proximity of, that is, the change in an electric signal given by an outside signal source to the part of the circuit can be known measuring the output of the photo detector 16 with an adequate measuring instrument. The wave plate functions to give a bias voltage optically, and the output intensity I should be $I_0/2$ with a wave plate, when voltage V is not given. The output intensity I is varying from $I_0/2$ when a voltage is given.

However, a sufficient detecting sensitivity could not be attained with the existing apparatus for measuring voltage because the structure is formed to detect a minute change of refraction caused in the E-O probe 4 by detecting the change in status of polarization of the light entering and returned from the E-O probe.

SUMMARY OF THE INVENTION

It is an object of the present invention to provide a voltage measuring apparatus comprising an electro-optic member, a refractive index of which varies depending on electrical field, a laser medium which enables light amplification and a resonator structure, where the electro-optic member and the laser medium are disposed in the resonator structure to detect a change in voltage at a local point on a measured object with high precision.

It is another object of the present invention to provide a voltage measuring apparatus which further comprises a first reflecting means having transmittance to light, a second reflecting means having higher transmittance to light than the first reflecting means, where both of the first reflecting means and the second reflecting means are disposed in the resonator structure.

It is still another object of the present invention to provide a voltage measuring apparatus where the first reflecting means is disposed at the opposite side end face of the laser medium to the electro-optic member, and the second reflecting means is a high reflection coating disposed at the opposite side end face of the electro-optic member to the laser medium.

It is yet another object of the present invention to provide a voltage measuring apparatus which further comprises a photo-detector to detect a light emitted out from the resonator structure through the first reflecting means.

It is yet another object of the present invention to provide a voltage measuring apparatus which further comprises a wave plate disposed along the optical path between the electro-optic member and the laser medium.

It is yet another object of the present invention to provide a voltage measuring apparatus where the wave plate gives an optical bias voltage to have the output of the photo-detector vary sharply as the electro-optic member is given a voltage. The most appropriate range of such a voltage is from $V_\pi/2$ to $V_\pi$.

The voltage measuring apparatus mentioned above can detect a change of the electrical field adjacent to an electro-optic member with high sensitivity from outside as a change of the resonant status of laser resonance caused by a change of a refractive index in the electro-optic member, since there are disposed the electro-optic member for detecting the electrical field and a laser medium in the structure of the resonator. That is, a change in a refractive index of the electro-optic member caused by a change in the electrical field established in the measured object allows the overall resonance conditions included in the structure of resonator to vary. And, the intensity of laser beam emitted from the structure of resonator after amplified by the laser medium is very sensitive to the minute change in a refractive index of the electro-optic member which affects the conditions of resonance. Consequently, a sensitive detection can be made of a minute change in a refractive index of the electro-optic member or a change of electrical potential at a local part area of a measured object and the like, from outside without any contact by observing the laser beam emitted from the structure of resonance through by the first reflection means with an adequate means.

BRIEF DESCRIPTION OF THE DRAWINGS

The foregoing and other objects, features and advantages of the invention, as well as a presently preferred embodiment thereof, will become more apparent from a reading of the following description in connection with the accompanying drawings in which.

DETAILED DESCRIPTION OF THE PREFERRED EMBODIMENTS

The principle of an electrical voltage measuring apparatus according to the present invention is briefly described before the preferred embodiments are described.

Figure 1:
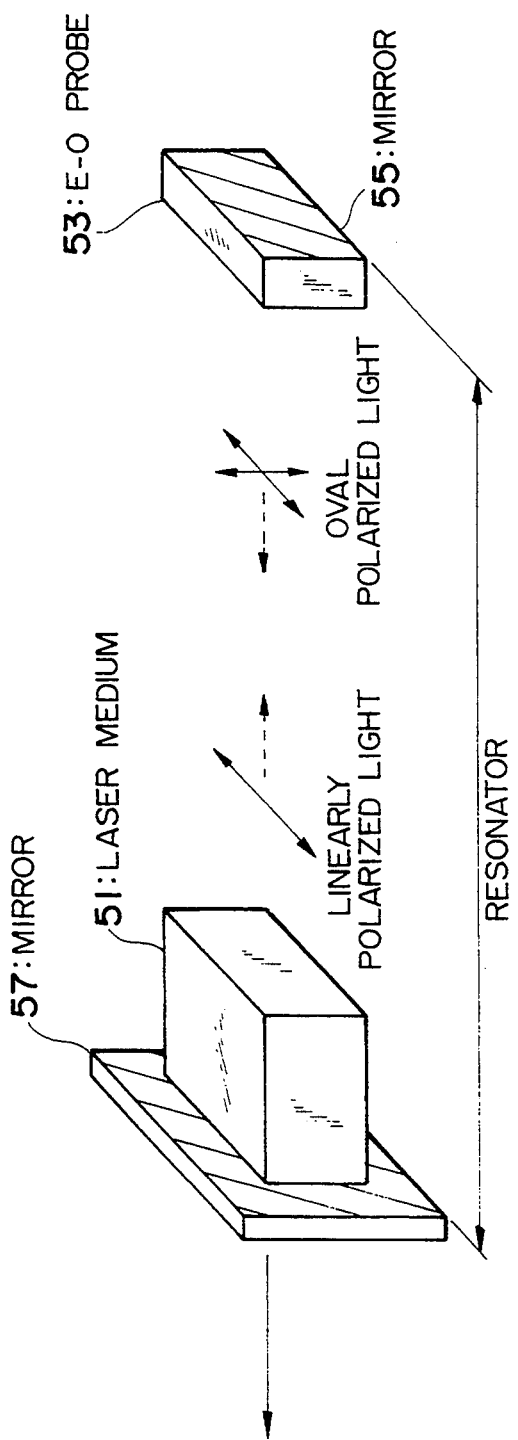
FIG. 1 shows a first example of structure of a voltage measuring apparatus of the present invention.

The first example of the construction of the electrical voltage measuring apparatus is shown in FIG. 1. In this example, a pair of mirrors for resonance 55 and 57 are disposed, between which is located a laser medium 51 and an E-O probe 53. A linearly polarized light is emitted from the laser medium 51. If the light beam emitted from the laser medium 51 is not linearly polarized, it can be linearly polarized by a polarizing element (not shown in the drawing) such as a polarizer or a Brewster Window located after the laser medium 51. The linearly polarized light comes back after entering the E-O probe 53 and being reflected by the mirror 55. When some voltage is exerted to the E-O probe 53 by the measured object, a change in a refractive index is caused in the E-O probe 53 corresponding to the intensity of the electrical field and the light from the E-O probe 53 is elliptically polarized. As a result, a status of resonance in the laser resonator varies depending on the voltage at the measured object. Accordingly, the intensity of the output light emitted from the laser resonator through the partially penetrating mirror 57 or a mirror with partial transmittance corresponds to the voltage existing at the local area of the measured object which the E-O probe 53 is in the proximity of.

Figure 2:
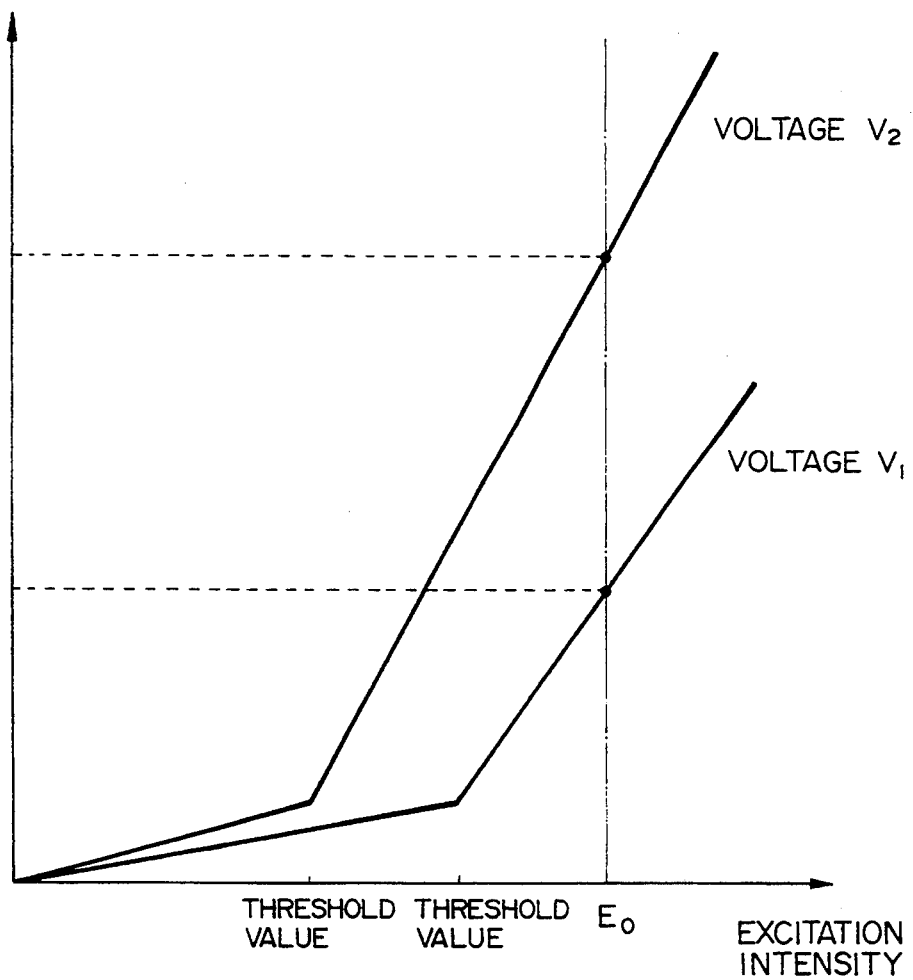
FIG. 2 shows curves describing operations of a voltage measuring apparatus in FIG. 1.

Output characteristics of the apparatus for the measurement of electrical voltages of FIG. 1 are shown in FIG. 2. The output characteristics are those when the voltages at the measured object (not shown in the drawing) are $V_1$ and $V_2$. As indicated in the drawing, threshold values of excitation intensity and slope efficiencies (differential efficiencies) are different respectively as voltages on the measured object are different. Here keeping the excitation intensity constant at $E_0$, the output light varies greatly with a change in the electrical field established in the E-O probe 53 or a change in the electrical signal given to the measured object. Accordingly, the voltage at the measured object can be determined with a high S/N (signal-to-noise) ratio by measuring the intensity I of the output light.

Figure 3:
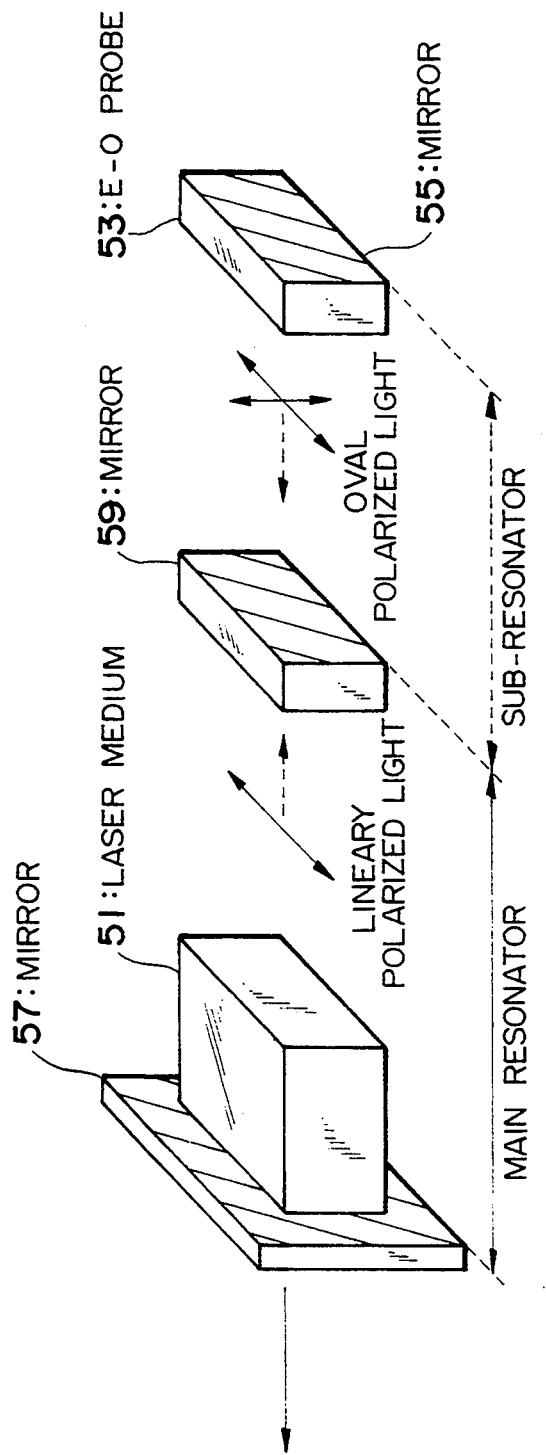
FIG. 3 shows a second example of structure of an voltage measuring apparatus of the present invention.

The second example of construction of the apparatus for the measurement of electrical voltages is shown in FIG. 3. In this example, a partially penetrating mirror 59 or a mirror with partial transmittance is disposed between a laser medium 51 and an E-O probe 53. The laser medium 51 is disposed in a main resonator between the mirror 57 and mirror 59, and the E-O probe 53 is disposed in a sub-resonator between the mirror 55 and mirror 57.

The linearly polarized light from the laser medium 51 is amplified in the main resonator. The linearly polarized light partially penetrates the mirror 59 and enters the sub-resonator and comes back after being reflected by the mirror 55 and converted to elliptically polarized light depending on the electrical field established in the E-O probe 53. That is, the resonant status varies in the sub-resonator depending on the voltage at the measured object. Accordingly, the output light from the main resonator also reflects the voltage at the local area of the measured object which the E-O probe 53 is in the proximity of, affected by the sub-resonator. The output characteristics must be the same as those shown in FIG. 2.

The preferred embodiments of the present invention are described hereunder in detail.

Figure 4:
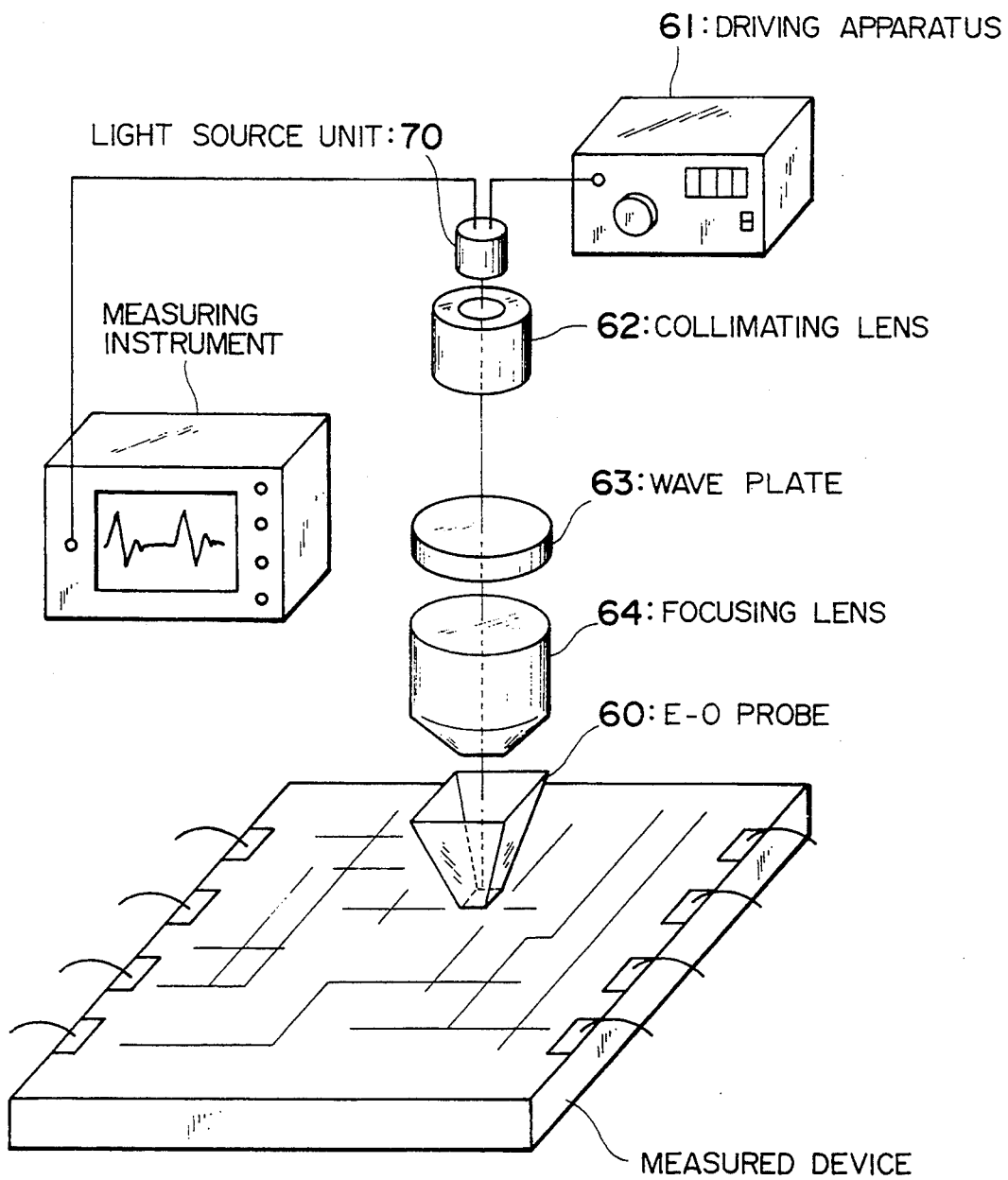
FIG. 4 shows a first embodiment of a voltage measuring apparatus of the present invention.

FIG. 4 shows a first embodiment of a voltage measuring apparatus of the present invention. A refractive index of the E-O probe 60 varies in response to the electrical field from the measured device, such as, a semiconductor device. A light beam emitted by a light source unit 70 which is controlled by a driving apparatus 61 enters the E-O probe 60, through a collimating lens 62, a wave plate 63 and a focusing lens 64 in this order.

Figure 5:
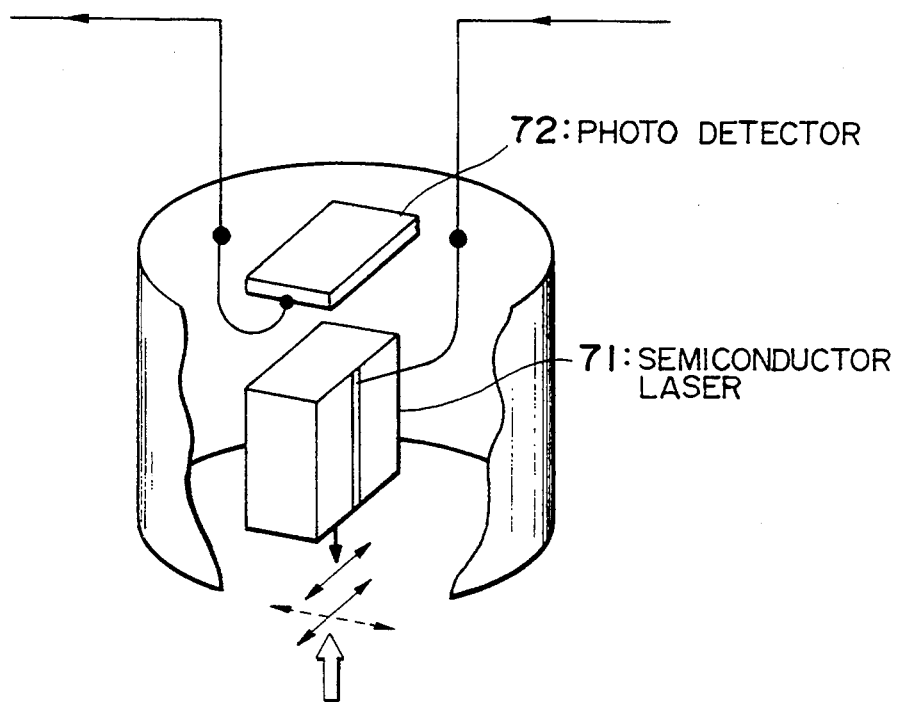
FIG. 5 shows an enlarged drawing of a part of the apparatus in FIG. 4.

FIG. 5 shows an enlarged view of the light source 70. A driving signal from a driving apparatus 61 is applied to a stripe of a semiconductor laser 71. AR (anti-reflection) coating is applied on the bottom face of the semiconductor laser 71. The top face is a cleavaged face and is partially penetrated by light. It is possible to adjust the penetration ratio or transmittance by forming a mirror at the top face. Additionally, a high reflection mirror is formed on the bottom face of the E-O probe 60 shown in FIG. 4. The high reflection mirror has a higher reflectance than the top face mirror. The high reflection mirror is often formed of a high reflection coating. Accordingly, a laser resonator is formed between the top face of the semiconductor laser 71 and the bottom face of the E-O probe 60. The intensity of the output light emitted from the to face of the semiconductor laser 71 is detected by a photo-detector 72 built in the same package and the result is displayed on an instrument. The output of the photo-detector 72 corresponds to the voltage at the local area of the measured object which the E-O probe 60 is in the proximity of.

The operation of the apparatus in FIG. 4 is described hereafter. A linearly polarized light is emitted from the bottom face of the semiconductor laser 71. If the light beam emitted from the semiconductor laser 71 is not linearly polarized, it can be linearly polarized by a polarizing element (not shown in the drawing) such as a polarizer or a Brewster Window placed between the semiconductor laser 71 and the E-O probe 60. The linearly polarized light is converted to an adequate elliptically polarized light by the wave plate 63 and enters the E-O probe 60. When some voltage is given to the measured object, a change in a refractive index is caused in the E-O probe 60 depending on the intensity of the electrical field established in the E-O probe 60, and the status of polarization of the light which is reflected by the high reflectance mirror at the bottom face of the E-O probe 60 and emitted from E-O probe 60 is changed. The high reflectance mirror at the bottom face is formed at the bottom face of the E-O probe 60 and has a high reflectance characteristics. The light passes the wave plate 63 and its polarization status is changed again. The light enters an active layer of the semiconductor laser 71 where the light is linearly polarized and causes induced emission or stimulated emission in the active layer at the same time. Under the conditions, when the electrical field established in the E-O probe 60 by the measured object varies, the resonance status of the laser resonator is changed. That is, the intensity of the output light detected by the photo-detector 72 after emitted from the top face of the semiconductor laser 71 reflects the voltage existing at a local area of the measured object which the bottom tip of the E-O probe 60 is in the proximity of. Accordingly, the voltage at the measured object can be determined with high sensitivity by measuring the output of the photo-detector 72.

Figure 12:
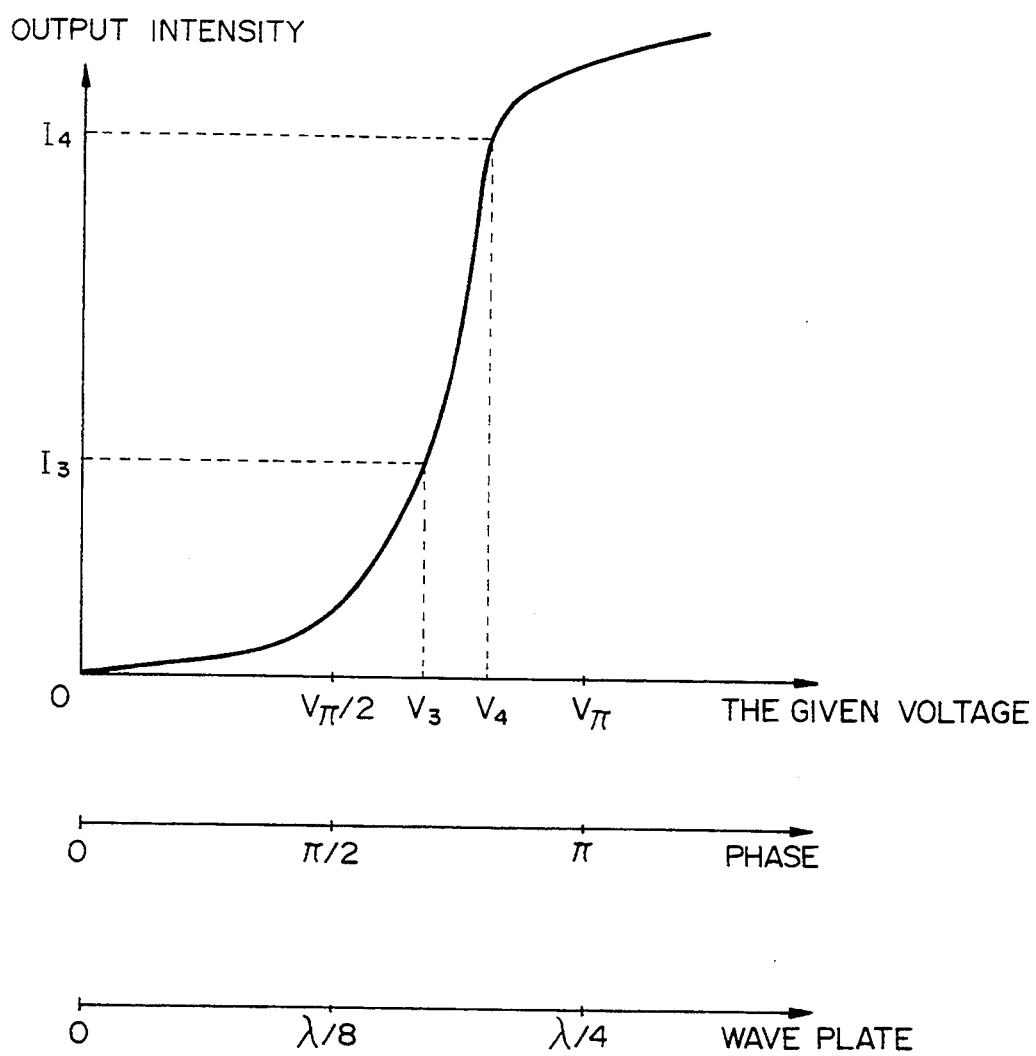
FIG. 12 shows curves describing operations of a voltage measuring apparatus of the present invention.

The operation principles of the apparatus in FIG. 4 is described in more detail with reference to FIG. 12. The curve indicates the a relationship between a bias voltage V given to the measured device and an intensity I of the output light. The curve indicates a characteristic (V-I) in case where the wave plate 63 is not put in position. Optical phase in FIG. 12 means a phase difference caused when a laser beam passes a wave plate 63, and is indicated as a phase difference while the laser beam passes the wave plate 63 twice. Wave plate in FIG. 12 indicates a relationship between a phase difference and a kind of the wave plates 63. That is to say, it indicates an interrelation with the above mentioned phase difference when different wave plates such as a $\lambda/8$ wave plate, a $\lambda/4$ wave plate or the like are used. Accordingly, the phase difference is $\pi/2$ in case of a $\lambda/8$ wave plate, and in case of a $\lambda/4$ wave plate, and further the given voltages V correspond to $V_\pi/2$, and $V_\pi$ respectively.

Here, the above mentioned relationship between a phase difference and a wave plate 63 is described in more detail. For example, in case of a $\lambda/8$ wave plate, the phase difference is $2\pi/8 = \pi/4$ when the laser beam passes the $\lambda/8$ wave plate only once, but it is $(\pi/4)*2 = \pi/2$ in the present invention because the apparatus is provided with a laser resonator and the laser beam travels forth and returns upon reflection. Because the laser beam passes the wave plate 63 twice the phase difference is as indicated in FIG. 12.

The relationship between the voltage V at the measured device and the output intensity I detected by the photo-detector 72 is given by the formula $I = I_0 \cdot \sin^2\{(\pi/2)(V/V_\pi)\}$. That is, in the present invention, the output intensity I is small when the given voltage V is small, but the output intensity I will increase sharply as the given voltage increases. This is due to a strong resonance status being attained as a Q value of the laser resonator becomes high when the given voltage increases. FIG. 12 indicates that a very big change ($I_4 - I_3$) in the output intensity I can be attained as the voltage varies for example from $V_3$ to $V_4$. Here, the amount of change in the output intensity I is compared with that in the related background art shown in FIG. 11. Setting the amount of change in the given voltage for $V_2 - V_1 = V_4 - V_3$, the amount of change in the output intensity is $I_2 - I_1 < I_4 - I_3$. That is to say, the amount of change of the output intensity in the present invention is larger than that in the related background art, which has been experimentally confirmed.

Figure 11:
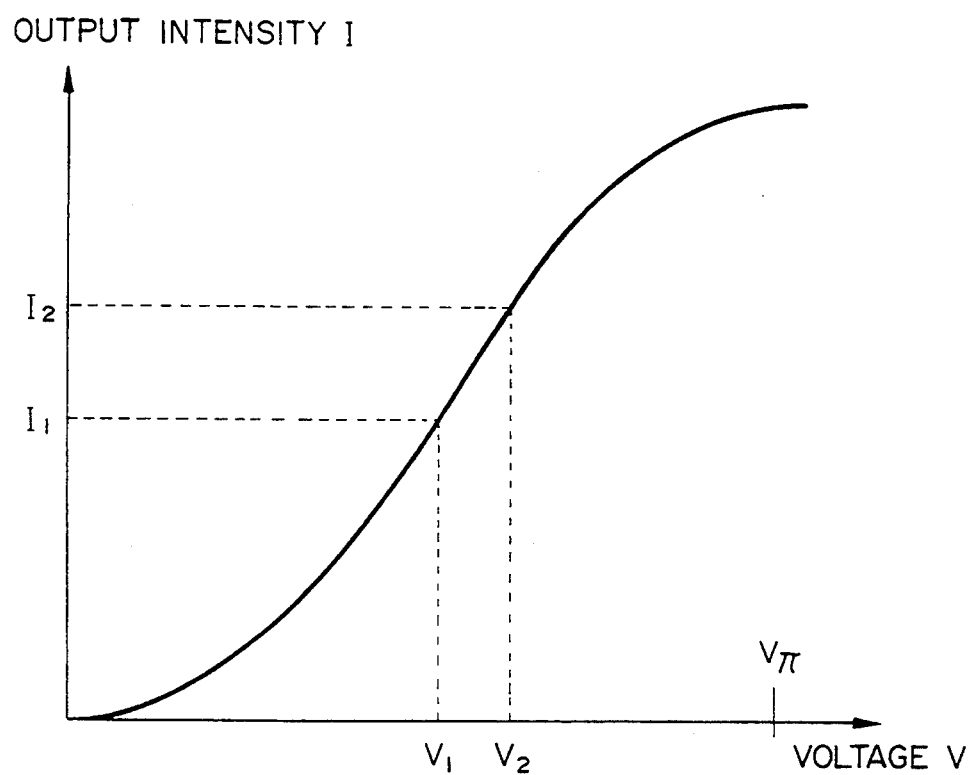
FIG. 11 shows curves describing operations of an existing apparatus for measuring voltages.

To get such a result, however, an appropriate wave plate 63 should preferably be chosen. In the related background art apparatus as shown in FIG. 11, a $\lambda/8$ wave plate 12 is put in the light path to set an optical bias voltage $V_B$ and a given voltage $V_1$ for $V_\pi/2$. On the other hand in the present invention, an output intensity detected by the photo detector 72 is attempted to be high through setting an optical bias voltage $V_B$ and a given voltage $V_3$ for a range from $V_\pi/2$ to $V_2$, where the output intensity varies sharply. In a case shown in FIG. 12, a $(3/16)\lambda$ wave plate must be the most appropriate if the setting is $V_B = V_3 = 3*V_\pi/4$. As mentioned above, first a predetermined voltage $V_B$ is determined in a voltage range where a change of the output intensity varies sharply in V-I characteristics. Second, a wave plate 63 corresponding to the voltage $V_B$ is selected. The most appropriate range of the voltage $V_B$ is from $V_\pi/2$ to $V_\pi$. A wave plate 63 corresponding to the voltage is form a $\lambda/8$ wave plate to a $\lambda/4$ wave plate. As mentioned above, the present invention enables a large amount of change in the output intensity by giving an adequate optical bias voltage.

Figure 6:
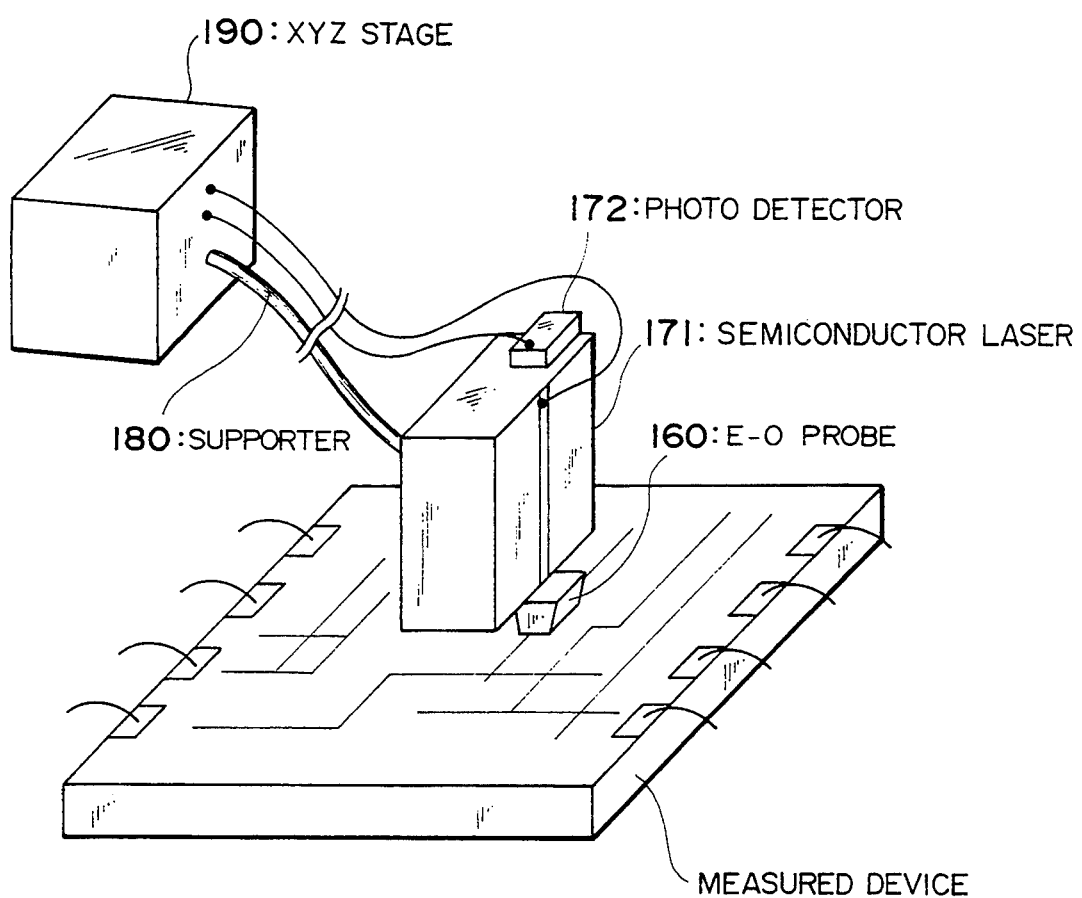
FIG. 6 shows a second embodiment of a voltage measuring apparatus of the present invention.

FIG. 6 shows a second embodiment of an apparatus for measuring voltages of the present invention. Different from the first embodiment, this embodiment does not need a collimating lens, a wave plate and a focusing lens. An E-O probe 160 is directly attached to the bottom face of the semiconductor laser 171 as an integrated unit. This integration enables to be miniaturized the apparatus to the extent unexpected before.

The electrical field from the measured device causes a refractive index of the E-O probe 160 to vary. The light to be detected enters the E-O probe 160 directly from the semiconductor laser 171. Since a resonator is formed between the top face of the semiconductor laser 171 and the bottom face of the E-O probe 160, the output light detected by the photo-detector 172 fixed at the top of the semiconductor laser 171 corresponds to the voltage given to the area which the E-O probe 160 is in the proximity of. The semiconductor laser 171 to which the E-O probe 160 is fixed is connected to XYZ stage 190 with a supporter 180. With the XYZ stage 190, it is not necessary to scan the measured object and voltage distribution can be determined 2-dimensionally precisely on a minute measured device such as IC. The XYZ stage 190 has a stage which can accommodate a measured object and be controlled to move 3-dimensionally.

The operation of the apparatus in FIG. 6 is described hereafter. A linearly polarized light is emitted from the bottom face of the semiconductor laser 171. This linearly polarized light enters the E-O probe 160.

When some voltage is given to the measured object, a change in a refractive index is caused in the E-O probe 160 depending on the intensity of the electrical field, and a status of polarization of the light which is reflected by the mirror at the bottom face of the E-O probe 160 and emitted from E-O probe 160 is changed. Accordingly, the amplitude of the light entering the active layer of the semiconductor laser 171 corresponds to the change in the refractive index of the E-O probe 160. After all, the resonance status of the laser resonator can be changed corresponding to the voltage from the measured object. And, the intensity of the output light detected by the photo-detector 172 after emitted from the top face of the semiconductor laser 171 corresponds to the voltage existing at a local area of the measured object which the E-O probe 160 is in the proximity of. Accordingly, the 2-dimensional distribution of the voltage can be determined with high sensitivity by measuring the output of the photo-detector 172.

Figure 7:
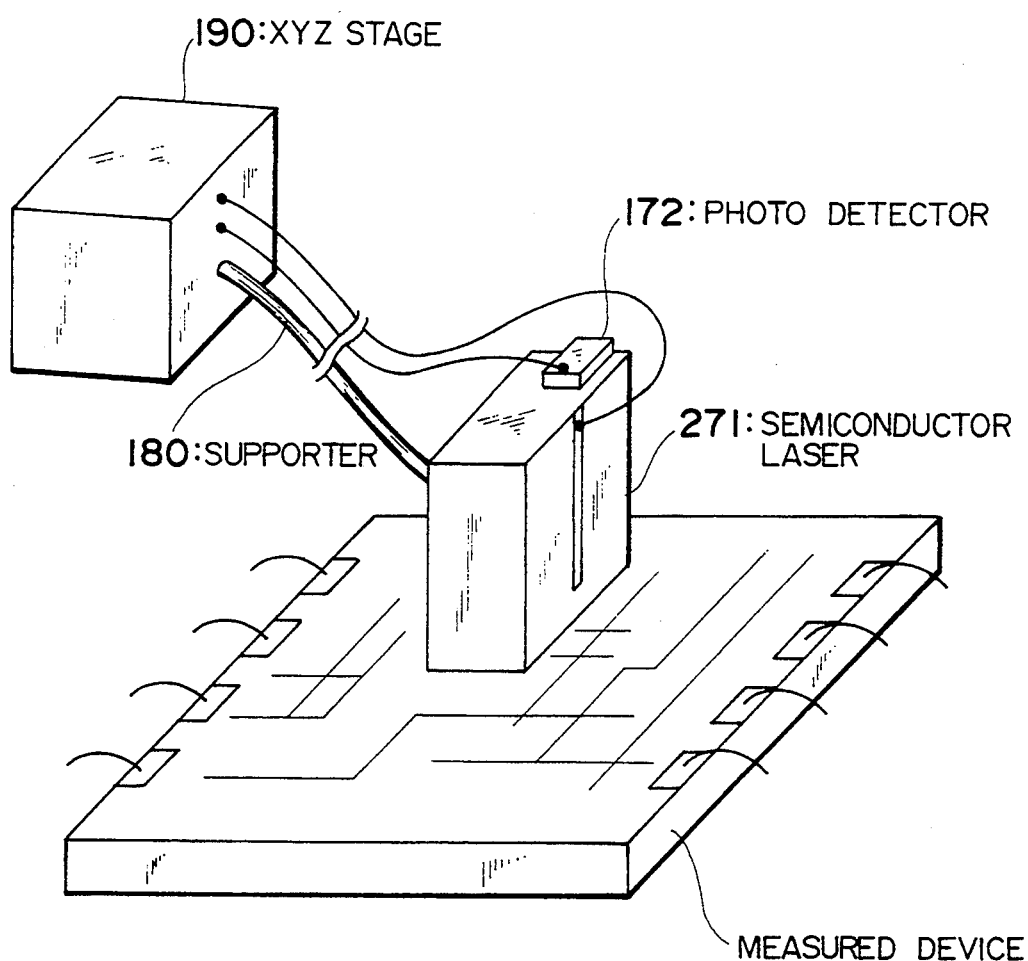
FIG. 7 shows a third embodiment of a voltage measuring apparatus of the present invention.

FIG. 7 shows a third embodiment of an apparatus for measuring voltages of the present invention. This is an embodiment modified from the apparatus of the second embodiment. The same numeral as in the second embodiment is assigned to the corresponding part, and no description is repeated concerning it. The device is one in which the semiconductor laser 271 is of GaAs type material. Since a material such as GaAs has electro-optic effect itself, it is not necessary to provide with a E-O probe. That is, the semiconductor laser 271 itself can function as an E-O probe without a need for a separate E-O probe 160. The stripe electrode for inputting electrical current-to the semiconductor laser 271 may be partially removed at the measured object side end to give this part high resistance, and consequently the modulation of resonance condition by the electrical field from the measured object or the modulation of the output light to be detected can be of high efficiency.

Figure 8:
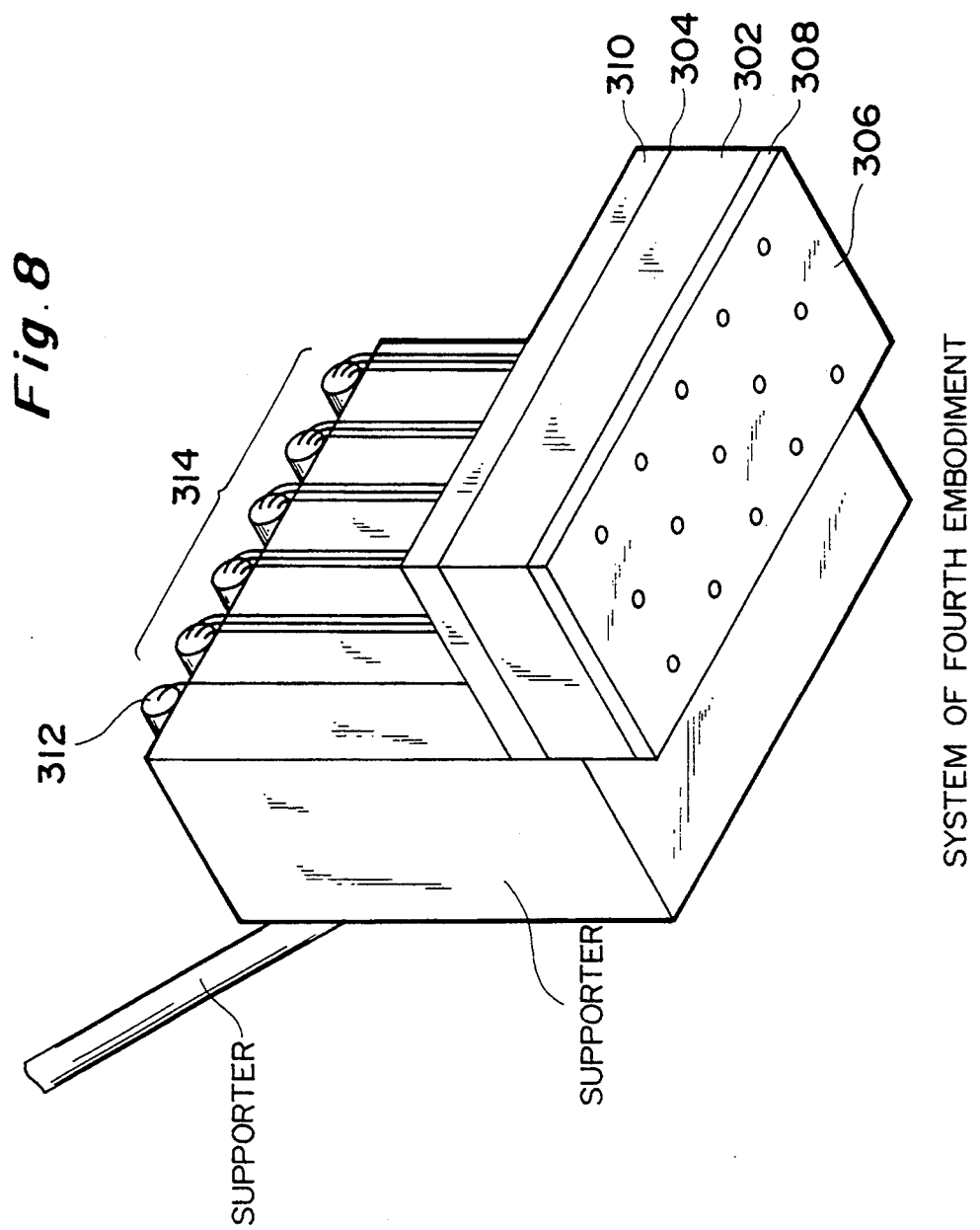
FIG. 8 shows a fourth embodiment of a voltage measuring apparatus of the present invention.

FIG. 8 shows a fourth embodiment of an apparatus for measuring voltages of the present invention. This is an embodiment further modified from the apparatus of the second embodiment. In this embodiment, not an LD (laser diode) as a type of taking advantage of a cleavage face of GaAs but a surface emitting laser 302 which has a number 0f luminescence areas within the output face is used, and the formation illustrated in FIG. 3 is adopted. At the top face of the surface emitting laser 302, a partially penetrating mirror 304 is formed. An array type photo detector 310 is disposed on the mirror. At the bottom side of the surface emitting laser 302, a polished and thin E-O probe 308 is attached. In addition, a high reflection mirror 306 is formed under the probe. Here, the partially penetrating mirror 304 and the high reflection mirror 306 form a resonator structure. Each emitting element of the surface emitting laser 302 luminesces simultaneously responding to the electrical current from the source cable 312 for LD. The output from each detecting element of the array type photo-detector leads to a measuring instrument through the output cable 314. When a CCD (charge coupled device) is used in place of the array type photo-detector 310, only an output cable is enough.

Figure 9:
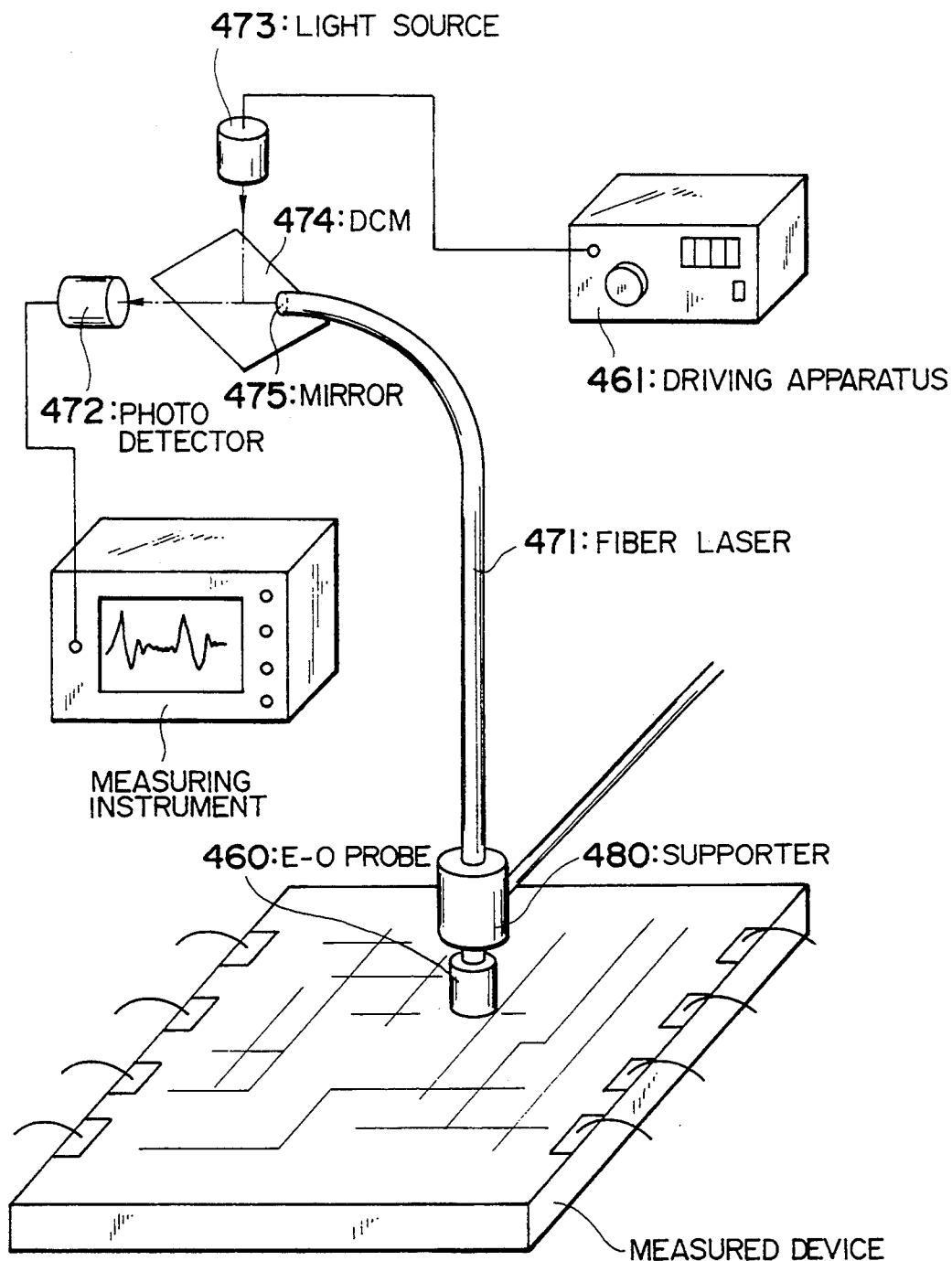
FIG. 9 shows a fifth embodiment of a voltage measuring apparatus of the present invention.
Figure 10:
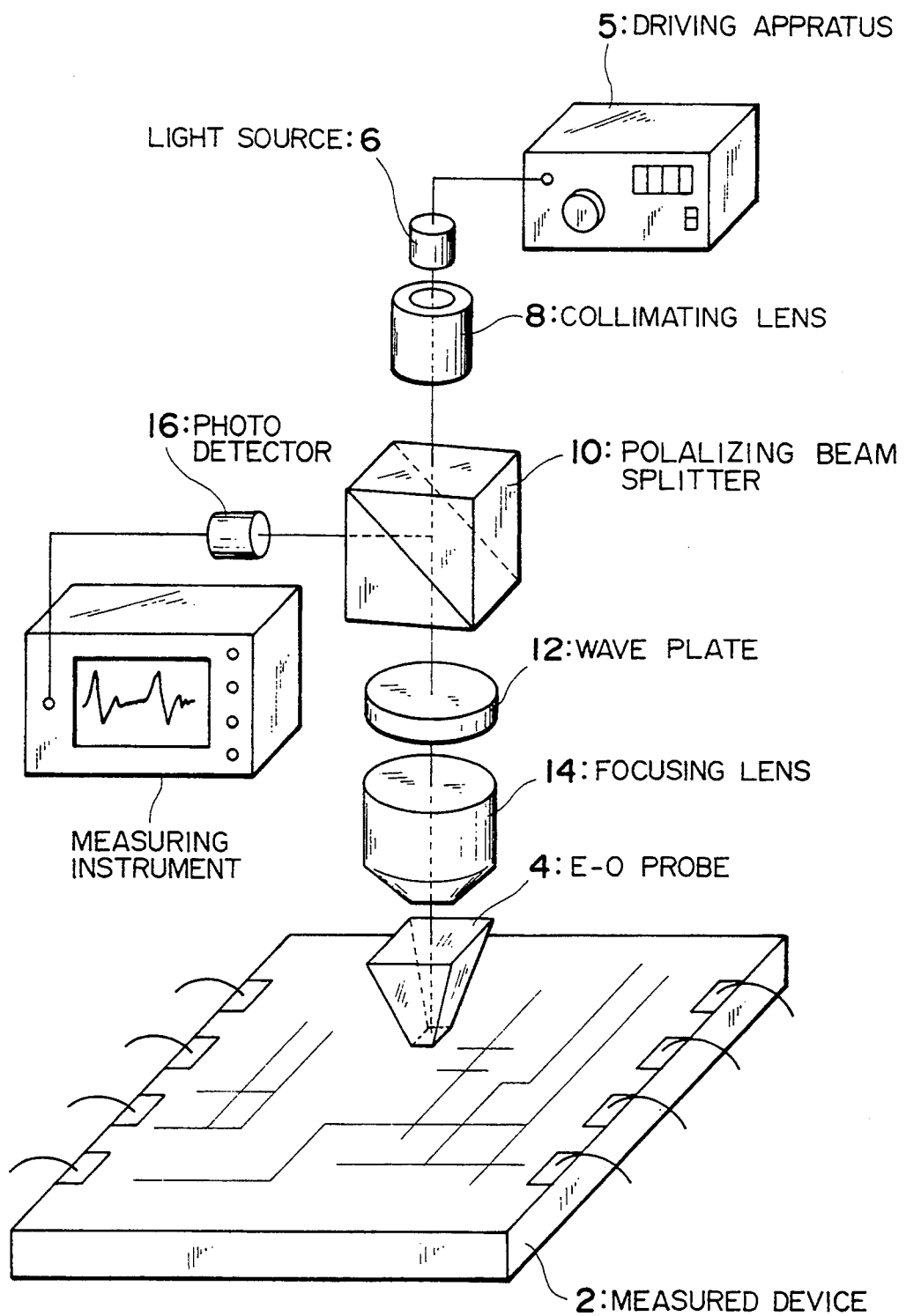
FIG. 10 shows a structure of an existing apparatus for measuring voltages.

FIG. 9 shows a fifth embodiment of an voltage measuring apparatus of the present invention. This is an embodiment modified from the apparatus of the second embodiment. In the embodiment, a fiber laser is used, to which an activated substance such as Er (erbium) is added. Light output from an exciting light source 473 enters the fiber 471 through DCM (dichroic mirror) 474. Since a resonator structure is formed by the entrance mirror of the fiber 471 and the mirror at the bottom face of the E-O probe 460, induced emission of the activated substance in the fiber 471 can cause laser resonance. This kind of resonance status in the laser fiber reflects the refractive index of the E-O probe 460. Therefore, the output light to be detected by the photo-detector 472 after being emitted from the mirror 475 and passing through the DCM 474 corresponds to the refractive index of the E-O probe 460, that is, corresponds to the voltage on the measured object. Accordingly, the voltage distribution on the measured object can be precisely determined by measuring the output of the photo-detector 472 with scanning action of the supporter 480.

The present invention is not restricted to the above mentioned embodiments. For example, the laser medium can be a gas as used for He—Ne laser, Ar laser or the like, or a solid such as Nd:YAG, Ti:sapphire, Cr:LiSAF or the like.

With an apparatus for measuring voltages of the present invention, a change in the electrical field adjacent to the electro-optic member can be sensitively detected from outside, as a change in resonance conditions of laser resonance due to the change in the refractive index caused in the electro-optic member, since the electro-optic member for detecting the electrical field and the laser medium are disposed in the resonator structure. In other words, since the intensity of the laser light emitted from the resonator structure is very sensitive to even a minute change in the refractive index of the electro-optic member, the minute change in the refractive index of the electro-optic member or voltage change at a local area of the measured object or the like can be sensitively detected from outside without any contact, observing the laser light from outside.

From the foregoing description it will be apparent that there has been provided an improved voltage measuring apparatus with high sensitivity and precision. Variations and modifications in the herein described apparatus, within the scope of the invention, will undoubtedly suggest themselves to those skilled in the art. Accordingly, the foregoing description should be taken as illustrative and not in a limiting sense.

What is claimed is:

1. A voltage measuring apparatus, comprising:
   an electro-optic member having an index of refraction that varies depending on an electrical field applied to said electro-optic member;
   a laser medium for providing light to said electro-optic member; and
   a resonator structure including said laser medium and said electro-optic member disposed therein, said resonator structure resonating said light emitted from said laser medium and passed through said electro-optic member.

2. A voltage measuring apparatus as recited in claim 1, wherein said resonator structure further comprises:
   a first reflector having a transmittance to said light; and
   a second reflector having a higher reflectance to said light than said first reflector.

3. A voltage measuring apparatus as recited in claim 2, wherein:
   said first reflector is disposed on an end face of said laser medium remote from said electro-optic member; and
   said second reflector includes a reflection coating which is disposed on an end face of said electro-optic member remote from said laser medium.

4. A voltage measuring apparatus as recited in claim 2, further comprising:
a photo-detector which detects a light emitted out from said resonator structure through said first reflector.

5. A voltage measuring apparatus as recited in claim 1, further comprising:
a wave plate disposed along an optical path between said electro-optic member and said laser medium.

6. A voltage measuring apparatus as recited in claim 5, wherein
said wave plate provides an optical bias voltage which is in a range from $V_\pi/2$ to $V_\pi$.

7. A voltage measuring apparatus, comprising:
an electro-optic member having an index of refraction that varies depending on an electrical field applied to said electro-optic member;
a laser medium for providing light to said electro-optic member; and
a resonator structure including said laser medium disposed therein for amplifying said light.

8. A voltage measuring apparatus, comprising:
an electro-optic member having an index of refraction that varies depending on an electrical field applied to said electro-optic member;
means, responsive to a change in said index of refraction, for changing a resonant status of light emitted from said electro-optic member, wherein an intensity of said electric field is detected based on said change in said resonant status.

9. A voltage measuring apparatus as recited in claim 1, wherein said light emitted from said laser medium is provided directly to said electro-optic member.

* * * * *